United States Patent [19]

Shum

[11] 4,056,774
[45] Nov. 1, 1977

[54] ELECTRONIC WATTHOUR METER CIRCUIT

[75] Inventor: Lanson Y. Shum, Delmont, Pa.

[73] Assignee: Westinghouse Electric Corporation, Pittsburgh, Pa.

[21] Appl. No.: 736,797

[22] Filed: Oct. 29, 1976

[51] Int. Cl.² ............................................. G01R 21/06
[52] U.S. Cl. .................................................... 324/142
[58] Field of Search ................... 324/142; 235/151.31, 235/194

[56] References Cited

U.S. PATENT DOCUMENTS 3,517,311  6/1970  Wasielewski et al. ............... 324/142

FOREIGN PATENT DOCUMENTS 829,472    12/1969  Canada .................................. 324/142
1,313,511   4/1973  United Kingdom ................. 324/142

Primary Examiner—Stanley T. Krawczewicz
Attorney, Agent, or Firm—R. W. Smith

[57] ABSTRACT

An electrical energy measuring circuit is responsive to two analog signals proportional to the voltage and current components of an electrical energy quantity to be measured. Voltage-to-frequency converters convert sampled DC voltages into first and second pulse trains having frequencies proportional to the peak voltage levels and the related levels of active or reactive current. A binary counter is incremented at a fixed rate by the sampling pulses. The binary counter is periodically reset by one of the pulse trains. The accumulated counter value is applied to a down binary counter which counts down at the frequency of the second pulse train. Borrow pulses are generated to provide an indication of electrical energy consumption.

10 Claims, 2 Drawing Figures

ELECTRONIC WATTHOUR METER CIRCUIT

BACKGROUND OF THE INVENTION

1. Field of the Invention

This invention relates to electronic watthour meter circuits, and more particularly, to an electronic watthour meter circuit having a digital counter arrangement for computing the product of voltage and current components.

2. Description of the Prior Art

The electromechanical rotating disc type of watthour meter continues to be used almost exclusively in utility and commerical electrical energy metering applications, but alternative methods are sought in developing electronic watthour meter circuits with high reliability and low cost. Basically two methods are known to measure electrical energy by electronic watthour meters. The electrical energy supplied through a circuit is the product of the measured power and the period of time that that power level is measured. AC electric power can be expressed as a mathematical equation as either:

$$P = \frac{1}{T} \int_O^T vi\, dt \text{ or } \frac{1}{T} \int_O^T VI \cos \theta\, dt$$

where
 $v$ = instantaneous voltage;
 $i$ = instantaneous current;
 $T$ = a predetermined time interval.
or where
 $V$ = maximum voltage;
 $I$ = maximum current;
 $\theta$ = phase angle between voltage and current; and
 $\cos \theta$ = power factor.

Electronic watthour meters that utilize the integration method must sample the voltage and current waveforms continuously. They also provide some form of function multiplier and integrator. In U.S. Pat. No. 3,500,200 a circuit is described for modulating the height and width of pulses of a pulse train responsive to voltage and current signals. The area under each pulse then represents power. An average of the pulse areas over measured time intervals gives the average power supplied through an external circuit. U.S. Pat. Nos. 3,760,273 and 3,875,509 disclose similar methods of pulse modulation and averaging in energy measuring circuits.

Peak signal level measuring electronic watthour meters typically include some form of function multiplier and a means for determining the power factor quantity $\cos \theta$. In U.S. Pat. No. 3,171,311 a phase comparator is disclosed to compute the phase angle $\theta$ and a cosine function circuit uses the angle $\theta$ to compute the power factor quantity $\cos \theta$.

SUMMARY OF THE INVENTION

In accordance with the present invention, an electronic watthour meter circuit includes peak waveform measuring and sampling technique and derives a power factor computing function without the need for additional phase sensing circuitry. The electronic watthour meter circuit uses transformers to develop sinusoidal voltage and current related analog signals proportional to the AC voltage and current components of electrical energy in an external circuit. The analog signals are translated into pulses and are digitally processed to effectively multiply the voltage and current related signals through binary counters.

The analog voltage signal, proportional to the external circuit voltage, triggers a first quarter cycle sample delay circuit upon every positive zero crossing. A delay circuit consists of a monostable multivibrator that generates a delay pulse having a duration of one-fourth of a voltage cycle. The trailing edge of the delay pulse triggers a second monostable multivibrator which generates a sampling pulse. The output of the second multivibrator is connected to two sampling circuit arrangements each including a field effect transistor (FET) and a storage capacitor.

The drain of one FET is connected to the voltage related signal while the drain of the other FET is connected to the current related signal. The sampling pulse turns on both FET's for the duration of the pulse, allowing the voltage and current analog signals to charge the two capacitors. The capacitors are charged to the level of the voltage and current related signals occurring at the time of the sampling pulse. At the sampling time, the voltage analog signal is at its maximum level, corresponding to the maximum voltage component amplitude occurring in the external circuit. The current related signal is at a level corresponding to the peak current component of the external circuit multiplied by the phase angle difference between the voltage and current components in the external circuit. To compute the active power of the external circuit, the two sampled signal levels are converted to variable frequency pulse trains.

A second quarter cycle sample delay circuit is provided for the current related signal. The current signal level is sampled after the added delay to derive a reactive current quantity for computing the reactive energy of the external circuit. An additional pair of monostable multivibrators are included in the second sample delay circuit. The multiplication of the voltage and current quantities to compute either active or reactive energy is performed by first converting the sampled voltage levels of the voltage and current related signals into pulse trains having frequencies proportional to the amplitude of the sampled voltages. A first pulse train whose frequency is proportional to the voltage component is used to reset a binary counter. The counter counts at the constant rate of the sampling pulses and each time it is reset the accumulated value of the counter is stored in a buffer. The buffer value is a quantity proportional to the reciprocal of the external circuit voltage. The buffer holds its value for use as an input to a down counter. The down counter is decremented at a rate equal to the frequency of a second pulse train which is proportional to the external circuit current. Each time the down counter reaches zero, a pulse is generated, corresponding to the current divided by the reciprocal of the voltage so as to indicate a predetermined amount of electrical power. The power pulses are totalized to produce an indication of the consumption of electrical energy.

The arrangement and operation of the present invention will be more clearly understood from the following detailed description with reference to the accompanying drawing.

DESCRIPTION OF THE PREFERRED EMBODIMENTS

Figure 1:
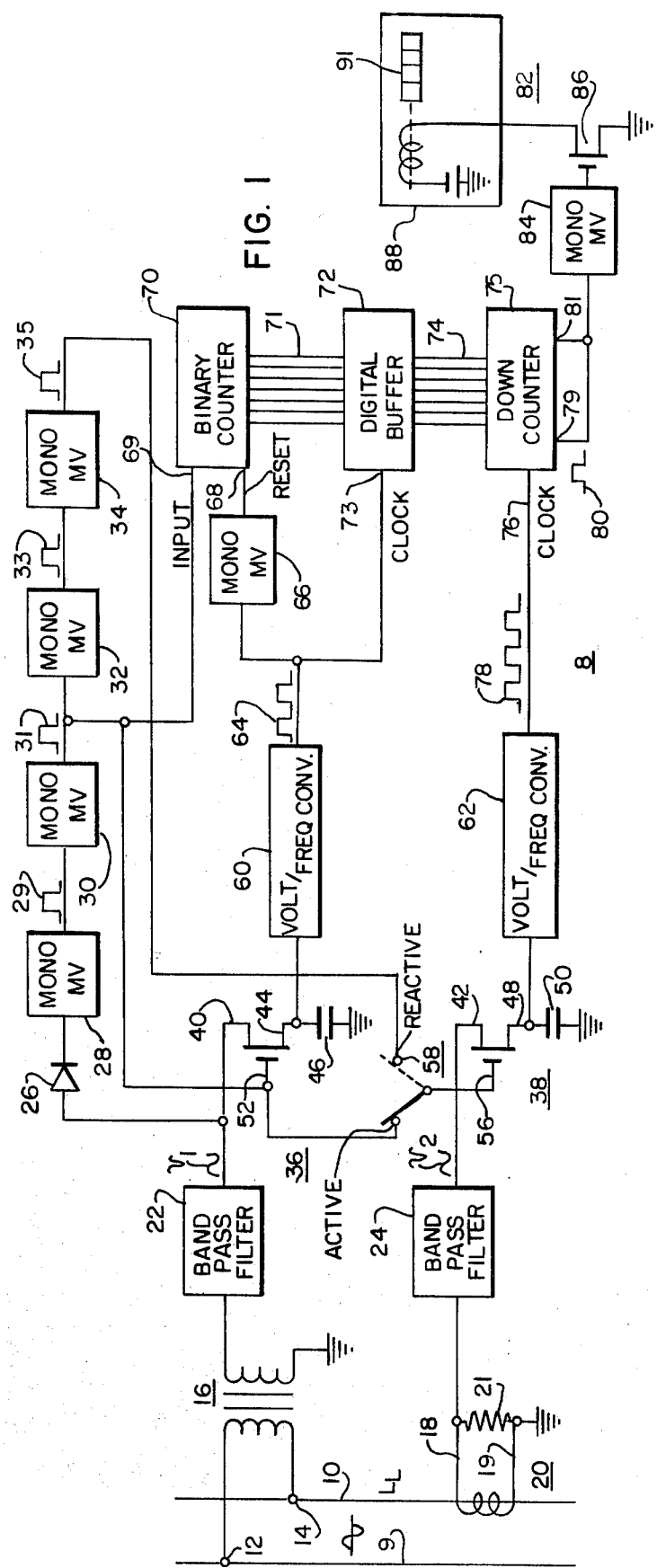
FIG. 1 is a schematic block drawing of an electronic watthour meter circuit constructed according to this invention.

Referring to FIG. 1, there is shown a schematic block diagram of a preferred embodiment of an electronic watthour meter circuit 8 of this invention which measures AC electrical energy flow. The invention is disclosed for measuring measure either active or reactive energy in a single-phase system including an AC electric source and load (not shown) connected together by conductors 9 and 10. The circuit 8 develops a pair of voltage and current related voltage signals, one of the signals $v_1$ of the pair being proportional to the voltage component $v_L$ of AC electric energy flowing in external line conductors 9 and 10 of the circuit to be measured. The other voltage signal $v_2$ of the pair is proportional to the current component $i_L$ of the electrical energy to be measured. Particular elements of the circuit of this invention and its operation will be described hereinbelow.

FIG. 1 shows the watthour meter circuit 8 made in accordance with this invention having a pair of voltage input terminals 12 and 14 connected to a voltage transformer 16, and current input terminals 18 and 19 connected to a current transformer 20. The outputs of the voltage transformer 16 and the current transformer 20 are responsive to the voltage and current components $v_L$ and $i_L$ of electrical energy flow through the conductors 9 and 10 and are connected to two bandpass filters 22 and 24. The output from the bandpass filter 22, is a sinusoidal voltage signal $v_1$ which is connected in series to a diode 26 and to cascaded connected monostable multivibrators 28 and 30 producing pulses 29 and 31. The monostable multivibrators 28 and 30 form a first sample delay circuit developing sampling pulses 31 described hereinbelow. The output of the monostable multivibrator 30 is connected to the input of a second sample delay circuit including the cascade connected monostable multivibrators 32 and 34 producing pulses 33 and second sampling pulses 35. The monostable multivibrators 28, 30, 32 and 34 can be formed by a circuit type SN74123 available from Texas Instruments, Inc., Dallas, Tex.

Field effect transistors (hereinafter called FET's) 36 and 38 are solid state switch devices used as sample gates. The output $v_1$ of the bandpass filter 22 is connected to the drain terminal 40 of the FET 36. The output of the bandpass filter 24 is a sinusoidal voltage signal $v_2$ connected to the drain terminal 42 of the FET 38. The source terminal 44 of the FET 36 is connected to one terminal of a storage capacitor 46. The other end of the capacitor 46 is connected to ground. The source terminal 48 of the FET 38 is connected to one terminal of a storage capacitor 50. The other end of the capacitor 50 is connected to ground. The gate terminal 52 of the FET 36 is connected to the output of the monostable multivibrator 30.

The gate terminal 56 of the FET 38 is connected to the common terminal of a single pole double throw switch 58. The switch 58 has two positions and in the solid line position shown, one terminal connects the gate terminal 56 of the FET 38 to the output of the monostable multivibrator 30. The other and broken line position of the switch 58 connects the gate terminal 56 of the FET 38 to the output of the monostable multivibrator 34 through the other switch terminal.

The input of a voltage-to-frequency converter 60 is connected to the source terminal 44 of the FET 36 and the capacitor 46. The input of a voltage-to-frequency converter 62 is connected to the source terminal 48 of the FET 38 and the capacitor 50. A pulse train 64 at the output of the voltage-to-frequency converter 60 is triggering input to a monostable multivibrator 66 which can be of the same circuit type SN74123 noted above. The output of the monostable multivibrator 66 is connected to the reset input 68 of a binary counter 70. The binary counter 70 can be of a type formed by two circuit type SN7493, four bit binary counters also available from Texas Instruments, Inc. The input 69 of the binary counter 70 is connected to the output of the monostable multivibrator 30. The eight bit outputs 71 of the binary counter 70 are connected into a digital buffer 72. The digital buffer 72 can be formed by two circuit type SN7475, four bit bistable latches, available from Texas Instruments, Inc., and has eight data inputs connected to the outputs 71 of the counter 70. The clock input 73 of the buffer 72 is connected to the output of the voltage-to-frequency converter 60. The Q outputs 74 of the buffer 72 are connected to the eight bit data inputs of a binary down counter 75. The down counter 75 can be formed by two circuit type SN74193, synchronous four bit up/down counters, also available from the Texas Instruments, Inc. The clock input 76 of the down counter 75 is responsive to the output pulse train 78 of the voltage-to-frequency converter 62. The borrow output 79 of the down counter 75, consisting of borrow pulses 80, is connected to its load input 81 and a pulse receiving and totalizing circuit 82. The circuit 82 includes a monstable multivibrator 84, an FET 86 and a pulse totalizer formed by an electromechanical counter 88 having a pulse actuated coil 90 and numeral display 91 driven by the coil 90. The display 91 provides an indication of the total of pulses 80 which correspond to the kilowatt hours of electrical energy flow in the conductors 9 and 10.

The operation of the circuit 8 will now be described in accordance with the preferred embodiment. Referring to FIG. 1, a line voltage $$v_L = V_L \sin(wt) + \sum_{n=1}^{\infty} V_n \sin(nwt)$$

having a fundamental frequency of 60 Hz and a maximum voltage of $V_L$ is applied from the conductors 9 and 10 to the input terminals 12 and 14 of the voltage transformer 16. The output of the voltage transformer 16 is a cyclically varying signal equal to $$\sin(wt) + \sum_{n=1}^{\infty} V_n \sin(nwt)$$

having a fundamental frequency of 60 Hz and a maximum voltage $V_1$ proportional to $V_L$ by the ratio of the number of turns of the secondary windings of the voltage transformer 16 divided by the number of terms of the primary windings of the voltage transformer 16. Line current $$i_L = I_L \sin(wt - \theta) + \sum_{n=1}^{\infty} I_n \sin(nwt - \theta)$$

having a fundamental frequency of 60 Hz and a peak current of $I_L$ is applied from the conductor 10 to the current transformer 20. The output of the current transformer 20 is a cyclically varying signal equal to $$V_2 \sin(wt - \theta) + \sum_{n=1}^{\infty} V_n \sin(nwt - \theta)$$

having a fundamental frequency of sixty Hz and a maximum voltage $V_2$ proportional to $I_L$ determined by the turns ratio of the current transformer 20 and the value of the resistor 21.

The 60 Hz active bandpass filters 22 and 24 are used to remove any harmonic frequencies that might be present in the sinusoidal voltage and current signals $v_1$ and $v_2$ received from the conductors 9 and 10 leaving only the 60 Hz fundamental frequency. Active rather than passive filters are used to eliminate the need for bulky inductors and capacitors and also to provide amplification of the analog signals. The output from the bandpass filter 22 is a cyclically varying sinusoidal signal $v_1 = V_1 \sin wt$ having a single frequency of 60 Hz and a maximum voltage of $V_1$. The output from the bandpass filter 24 is a cyclically varying sinusoidal signal $v_2 = V_2 \sin (wt-\theta)$ having a single frequency of 60 Hz and a maximum voltage $V_2$.

Figure 2:
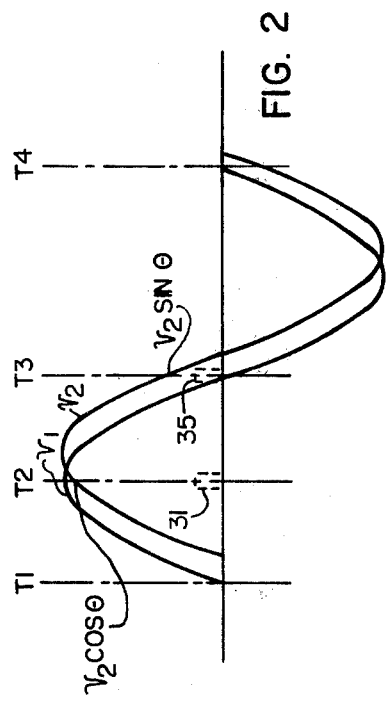
FIG. 2 is a time graph of the voltage and current related signal waveforms $v_1$ and $v_2$ shown in FIG. 1.

The switch 58 selects whether active or reactive energy is to be measured. In the active mode, the signal $v_2$ is fed into a sample delay circuit comprising the two cascaded monostable multivibrators 28 and 30. In FIG. 2, the positive zero crossing of $v_1$ occurs at time T1 and triggers the monostable multivibrator 28 and a delay pulse 29 having a duration corresponding to one quarter cycle (i.e. 4.16 millisecond) of $v_1$ is generated. The trailing edge of the delay pulse 29 triggers the monostable multivibrator 30, which generates at time T2 the sampling pulse 31, having a duration of approximately 100μs. The one quarter cycle delay allows $v_1$ to be sampled at its maximum value, as seen in FIG. 2. The sampling pulse 31 will therefore be generated once each cycle of 360 electrical degrees, between T1 and T4, of the frequency of $v_1$, which is 60 Hz.

The FET's 36 and 38 are connected to operate as switches, allowing conduction through the source and drain terminals when the threshold voltage level at the gates is exceeded. The voltage level of the pulse 31 exceeds the threshold level needed to turn the FET's 36 and 38 on. During the duration of the pulse 31 at the T2, the voltage signal $v_1$ flows through the FET 36 and charges the capacitor 46. The current signal $v_2$ flows through the FET 38 at time T2 and charges the capacitor 50. The time constants of the charging circuits are sufficiently small to allow the capacitors 46 and 50 to charge to the voltage levels of $v_1$ and $v_2$, respectively, within the duration of pulse 31 at time T2. The bandpass filters 22 and 24 are necessary to insure that a harmonic frequency waveform does not interfere and trigger the monostable multivibrator 28 at a time not corresponding to a zero crossing of the fundamental frequency. This would result in signal $v_1$ being sampled at other than its peak value, generating inaccurate measurement. By referring to FIG. 2, it can be seen that at the occurrence of pulse 31, the capacitor 46 will be charged to a maximum voltage level $V_1$, since the pulse 94 occurred at the peak of $v_1$. The capacitor 50 will be charged to a voltage level of $V_2 \cos \theta$, where $\theta$ is the phase angle between $v_1$ and $v_2$, corresponding to the phase difference between the voltage and current components $v_L$ and $i_L$ in the conductors 9 and 10.

When the switch 58 is positioned to select the reactive energy measurement mode, the pulse 31 also triggers the monostable multivibrator 32. The monostable multivibrator 32 along with a monostable multivibrator 34 are designed to form a second sample delay circuit portion similar to the monostable multivibrators 28 and 30. With the pulse 31 forming a trigger pulse to initiate the second sampling pulse 35, the monostable multivibrator 32 generates a delay pulse 33 having a duration of one quarter cycle of $v_1$ (i.e. 4.16 milliseconds) and one quarter cycle (90 electrical degrees) at time T3 in FIG. 2 after the time T2. The trailing edge of the pulse 33 triggers the monostable multivibrator 34 which then generates the second sampling pulse 35. In the reactive energy measuring mode, the pulse 35 gates the FET 38 rather than the pulse 31. The signal $v_2$ is therefore sampled by the pulse 35. From FIG. 2 it is seen that the capacitor 50 is charged to a level of $V_2 \sin \theta$ occurring at time T3. The reactive electrical power is computed in accordance with the mathematical expression $V_1 V_2 \sin \theta$ in the circuit 8.

With the switch 58 in the active energy measurement position, both $v_1$ and $v_2$ are sampled simultaneously at time T2 as shown in FIG. 2. With the switch 58 set to measure reactive energy, the sampling of $v_1$ remains the same as in the active position, but $v_2$ is sampled one quarter cycle later at the time T3. In either mode, $v_1$ and $v_2$ are sampled once a cycle, thereby updating the capacitors 46 and 50 at the fundamental frequency (i.e. 60 Hz) of the energy flow in the circuit to be measured. The diode 26 is inserted to prevent any back current generated by the monostable multivibrator 28 from being sampled along with $v_1$ when the FET 36 is conducting.

The input impedance of the voltage-to-frequency converters 60 and 62 is very high, so the capacitors 46 and 50 discharge very little between sampling times. The capacitors 46 and 50 therefore provide a substantially constant DC voltage input to the voltage-to-frequency converters 60 and 62. The voltage-to-frequency converter 60 produces a pulse train 64 having a frequency which is proportional to $V_1$, the peak value of the signal $v_1$. When the AC voltage $V_L$ is 120 volts, a corresponding repetition rate of the voltage related pulses 64 can be at a frequency of 0.25 Hz. The voltage-to-frequency converter 62 produces a pulse train 78 having a frequency which is proportional to the product of the current and a power factor related quantity, represented by $V_2 \cos \theta$ or $V_2 \sin \theta$, depending on whether active or reactive energy is being measured. When the current $i_L$ is varied between zero and 300 amperes, the repetition rate of the current related pulses 78 can be varied at frequencies between zero and 20 Hz.

The binary counter 70 is sequentially incremented by the individual pulses of the pulse train 31, which, in the embodiment shown, has a frequency of 60 Hz. The pulses 31 provide a constant repetition rate at the count input to the binary counter 70, so the counter 70 effectively counts continuously at a rate of 60 Hz. The eight bit counter output 74 produces a binary count of the pulses 31 occurring between successive ones of the pulses 64. Accordingly, the output 74 is responsive to the reciprocal of the voltage related quantity developed by the output of the converter 60.

The pulse train 64 from the voltage-to-frequency converter 60 performs a dual function. It acts as a clock input to a digital buffer 72, whereby the leading edge of each pulse of the pulse train 64 transfers the contents of the binary counter 70 into the digital buffer 72. Also, the pulse train 64 resets the counter 70. A monostable multivibrator 66 is provided to allow the counter 70 to be reset by the trailing edge of each pulse of the pulse train 64. The monostable multivibrator 66 therefore delays the reset of the counter 70 sufficiently to allow the contents of the counter 70 to be stored into the buffer 72 before reset occurs.

The magnitude of the contents of the counter 70 is determined by the frequency of the pulse train 64. As the frequency of the pulse train 64 increases, the counter 70 is reset more often. Since the counter 70 is incremented at a constant rate, an increase in the frequency of the pulse train 64 results in a decrease in the contents of the counter 70. The frequency of the pulse train 64 is proportional to the maximum voltage component of the external circuit, therefore the contents of the counter 70 is a value inversely proportional to the voltage component $v_L$ when at its maximum voltage value.

The pulse train 78 from the voltage-to-frequency converter 62 is used to decrement a down counter 75. The initial value for the down counter 75 is obtained from the buffer 72. When the down counter 75 becomes decremented to zero, a borrow pulse 80 is generated. Borrow pulses 80 occur at a rate proportional to the frequency of the pulse train 78 and inversely proportional to the initial value obtained from the buffer 72. Since the frequency of the pulse train 78 is proportional to the product of the maximum value of the current component and the power factor in the external circuit and the initial value of the down counter 75 is inversely proportional to the maximum value of the voltage component of the external circuit, therefore the rate of borrow pulses 80 is proportional to the current related quantity divided by the reciprocal of the voltage related quantity which is a measure of the rate that power is being supplied by the external circuit. Each borrow pulse 80 then represents a predetermined amount of electrical energy consumed by the external circuit. The operations at the counter 70, buffer 72, and down counter 75 are the same when the switch 58 is in either the active or reactive energy measuring position. In the embodiment shown, the circuit components are chosen to allow each borrow pulse 80 to represent 0.1 kWh.

The borrow pulse 80 also acts as a load trigger pulse to load input 81 which transfers the contents of the buffer 72 into the down counter 75. This acts to reinitialize the down counter 75. The borrow pulse 80 also triggers the monostable multivibrator 84. The pulse generated by the monostable multivibrator 84 gates an FET 86, allowing current to flow through the coil 90 and incrementing the electromechanical counter 88. The total of the counter indicated by display 91 provides a readout of the active or reactive electrical energy by the measured circuit with the last digit reading 0.1 kWh, depending upon the position of the switch 58 as described hereinabove.

While the present invention has been described in terms of a preferred embodiment, it is apparent that many modifications may be obvious to one skilled in the art. For example, the equivalent circuit elements may be incorporated in a single integrated circuit configuration and the circuit 8 is especially adaptable for manufacture in thin film circuit processes. It should be understood that these modifications fall within the scope and spirit of the appended claims.

I claim as my invention:

1. An electronic watthour meter circuit responsive to the voltage and current components of an AC electrical energy quantity to be measured, said circuit comprising:
   means producing a first sinusoidal voltage signal in response to said voltage conponent;
   means producing a second sinusoidal voltage signal in response to said current component;
   means producing a sampling pulse in response to each cycle of said first voltage signal;
   sampling means controlled by said sampling pulse for sampling said first and said second voltage signals during each cycle thereof;
   voltage-to-frequency converter means producing first and second pulse trains each having a frequency responsive to the sampled values of said first and said second voltage signals, respectively;
   binary counter means having a counter input, a reset input, and binary outputs, said counter input receiving said sampling pulse and said reset input receiving said first pulse train such that said output produces a binary output inversely proportional to the sampled value of said first voltage signal during each cycle of said first voltage signal; and
   down binary counter means having data inputs, a clock input and a borrow output, said data inputs receiving said binary counter outputs, said clock input receiving said second pulse train such that said borrow output produces pulses responsive to the sampled values of said second voltage signal divided by the inverse values of the sampled values of said first voltage signal, whereby said borrow output pulses are representative of the electrical energy quantity to be measured.

2. The electronic watthour meter circuit claimed in claim 1, wherein the sampling pulse producing means includes a sample delay circuit responsive to a zero crossing of said first voltage signal to produce each sampling pulse after a predetermined delay so that the maximum amplitude of said first voltage signal is sampled.

3. The electronic watthour meter circuit claimed in claim 2 wherein the sample delay circuit includes a first monostable multivibrator producing a delay pulse and a second monostable multivibrator circuit producing said sampling pulse in response to the end of said delay pulse.

4. The electronic watthour meter circuit claimed in claim 2 wherein said sampling means includes solid state switch means and capacitor means, said capacitor means being charged to the sampled values of said first and second voltage signal during the occurrence of said sampling pulse.

5. The electronic watthour meter circuit claimed in claim 2 wherein said sampling means includes first and second capacitors and first and second solid state switch means coupling said first and second voltage signal to said first and said second capacitors, respectively, when the sampling pulse is applied to gate terminals of said first and second solid state switch means.

6. The electronic watthour meter circuit claimed in claim 5 including means producing another sampling pulse at a predetermined time delay after the first named sampling pulse and single pole double throw switch means having first and second positions for selectively applying the first named sampling pulse and said another sampling pulse to the gate terminal of said second solid state switch means, whereby the borrow output pulses are representative of either active or reactive electrical energy quantities to be measured as determined by the positions of said single pole double throw switch means.

7. The electronic watthour meter circuit claimed in claim 6 wherein the first named sampling pulse is produced at the maximum amplitude of said first voltage signal such that said second voltage signal is sampled concurrently when the value thereof is equal to the maximum amplitude times the power factor of an active electrical energy quantity to be measured, upon said single pole double throw switch means being in said first position.

8. The electronic watthour meter circuit claimed in claim 7 wherein said second signal voltage is sampled by said another sampling pulse ninety electrical degrees after said first voltage signal is sampled so that said borrow output pulses are representative of a reactive electrical energy quantity to be measured, upon said single pole double throw switch means being in said second position.

9. The electronic watthour meter circuit of claim 1 including a buffer circuit means having corresponding inputs and outputs connected between said outputs of said binary counter means and said data inputs of said down binary counter means, and said buffer circuit means further having a clock input receiving said first pulse train so as to transfer the outputs of said binary counter means to said down binary counter means upon the occurrence of each pulse of said first pulse train.

10. The electronic watthour meter circuit of claim 9 including a pulse receiving means for receiving said borrow output pulses and totalizing the pulses to produce an indication of the electrical energy quantity to be measured.

* * * * *